(12) United States Patent
Nakamura

(10) Patent No.: US 10,171,064 B2
(45) Date of Patent: Jan. 1, 2019

(54) ELASTIC WAVE DEVICE AND ELASTIC WAVE MODULE

(71) Applicant: Murata Manufacturing Co., Ltd., Nagaokakyo-shi, Kyoto-fu (JP)

(72) Inventor: Soichi Nakamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 5 days.

(21) Appl. No.: 15/493,165

(22) Filed: Apr. 21, 2017

(65) Prior Publication Data

US 2017/0222625 A1      Aug. 3, 2017

Related U.S. Application Data

(63) Continuation of application No. PCT/JP2015/078582, filed on Oct. 8, 2015.

(30) Foreign Application Priority Data

Oct. 31, 2014   (JP) .................................. 2014-222762

(51) Int. Cl.
H03H 9/70      (2006.01)
H03H 9/72      (2006.01)
(Continued)

(52) U.S. Cl.
CPC ........ *H03H 9/6406* (2013.01); *H03H 9/0547* (2013.01); *H03H 9/0576* (2013.01);
(Continued)

(58) Field of Classification Search
CPC .............................. H03H 9/6483; H03H 9/725
(Continued)

(56) References Cited

U.S. PATENT DOCUMENTS 7,986,200 B2 *   7/2011   Ono ................... H03H 9/14588
                                                          333/193
2009/0224851 A1   9/2009   Feiertag et al.
(Continued)

FOREIGN PATENT DOCUMENTS

| JP | 2002-043890 A | 2/2002 |
| JP | 2008-546207 A | 12/2008 |
| WO | 2006/024262 A1 | 3/2006 |
| WO | 2011/102049 A1 | 8/2011 |

OTHER PUBLICATIONS

Official Communication issued in International Patent Application No. PCT/JP2015/078582, dated Dec. 1, 2015.

*Primary Examiner* — Dean Takaoka
(74) *Attorney, Agent, or Firm* — Keating & Bennett, LLP

(57) ABSTRACT

An elastic wave device includes a first piezoelectric substrate including a first principal surface and a second principal surface, a second piezoelectric substrate including a first principal surface and a second principal surface and with a greater thickness than that of the first piezoelectric substrate, and ground terminals located on the second principal surface of the first piezoelectric substrate. The first principal surface of the first piezoelectric substrate and the first principal surface of the second piezoelectric substrate are joined to face each other. On the first principal surface of the first piezoelectric substrate, a first elastic wave filter is located. On the first principal surface of the second piezoelectric substrate, a second elastic wave filter is located. The out-of-band attenuation of the first elastic wave filter is greater than the out-of-band attenuation of the second elastic wave filter.

19 Claims, 11 Drawing Sheets

(51) Int. Cl.
　　　*H03H 9/64*　　　(2006.01)
　　　*H03H 9/25*　　　(2006.01)
　　　*H03H 9/145*　　(2006.01)
　　　*H05K 1/18*　　　(2006.01)
　　　*H03H 9/05*　　　(2006.01)

(52) U.S. Cl.
　　　CPC .......... *H03H 9/14541* (2013.01); *H03H 9/25* (2013.01); *H03H 9/6433* (2013.01); *H03H 9/725* (2013.01); *H05K 1/181* (2013.01); *H05K 2201/1006* (2013.01)

(58) Field of Classification Search
　　　USPC .................................................. 333/133, 193
　　　See application file for complete search history.

(56) References Cited

U.S. PATENT DOCUMENTS

| | | | | |
|---|---|---|---|---|
| 2012/0306593 | A1* | 12/2012 | Kidoh .................. | H03H 9/1064 333/186 |
| 2013/0127566 | A1* | 5/2013 | Iwaki ................. | H03H 9/14594 333/133 |
| 2013/0222077 | A1* | 8/2013 | Ota ...................... | H03H 9/0576 333/133 |
| 2013/0307638 | A1* | 11/2013 | Kato .................... | H03H 9/0571 333/133 |
| 2015/0123744 | A1* | 5/2015 | Nishimura ............. | H03H 9/059 333/133 |
| 2017/0331456 | A1* | 11/2017 | Ono ................... | H03H 9/02637 |

\* cited by examiner

ELASTIC WAVE DEVICE AND ELASTIC WAVE MODULE

CROSS REFERENCE TO RELATED APPLICATIONS

This application claims the benefit of priority to Japanese Patent Application No. 2014-222762 filed on Oct. 31, 2014 and is a Continuation Application of PCT Application No. PCT/JP2015/078582 filed on Oct. 8, 2015. The entire contents of each application are hereby incorporated herein by reference.

BACKGROUND OF THE INVENTION

1. Field of the Invention

The present invention relates to elastic wave devices, for example, bandpass filters and the like, and the present invention also relates to elastic wave modules.

2. Description of the Related Art

Elastic wave devices have been used as bandpass filters of cellular phones and the like.

Japanese Unexamined Patent Application Publication No. 2008-546207 describes one example of such elastic wave devices. The elastic wave device of the Japanese Unexamined Patent Application Publication No. 2008-546207 includes two elastic wave elements. In each elastic wave element, an interdigital transducer (IDT) electrode is located on one of principal surfaces of a piezoelectric substrate. The forgoing two elastic wave elements are joined with a middle layer therebetween in such a way that the principal surfaces of the piezoelectric substrates, on which their respective IDT electrodes are formed, face each other. External connector terminals are located on an outside-facing principal surface of one of the piezoelectric substrates.

In an elastic wave device described in International Publication No. 2011/102049, two elastic wave elements are joined, as in Japanese Unexamined Patent Application Publication No. 2008-546207. In the International Publication No. 2011/102049, the thicknesses of piezoelectric substrates of the elastic wave elements are different from one another. External connector terminals are located on an outside-facing principal surface of the thinner piezoelectric substrate.

In Japanese Unexamined Patent Application Publication No. 2008-546207 and International Publication No. 2011/102049, however, the piezoelectric substrates are joined with the middle layer therebetween. This increases the distance between the external connection terminal and the elastic wave element on which no external connector terminal is formed. Thus, the foregoing elastic wave element has a large ground impedance. Accordingly, it is difficult to achieve a sufficiently large out-of-band attenuation in the elastic wave device.

SUMMARY OF THE INVENTION

Preferred embodiments of the present invention provide elastic wave devices and elastic wave modules that have large out-of-band attenuations.

An elastic wave device according to a preferred embodiment of the present invention includes a first piezoelectric substrate including a first principal surface and a second principal surface; a second piezoelectric substrate including a first principal surface and a second principal surface, a thickness of the second piezoelectric substrate being greater than a thickness of the first piezoelectric substrate; a plurality of first IDT electrodes and a plurality of second IDT electrodes, the plurality of first IDT electrodes being located on the first principal surface of the first piezoelectric substrate, and the plurality of second IDT electrodes being located on the first principal surface of the second piezoelectric substrate; and a plurality of external connection terminals located on the second principal surface of the first piezoelectric substrate. A first elastic wave filter including the plurality of first IDT electrodes is located on the first principal surface of the first piezoelectric substrate, a second elastic wave filter including the plurality of second IDT electrodes is located on the first principal surface of the second piezoelectric substrate, at least one of the plurality of external connection terminals is a ground terminal, the first piezoelectric substrate and the second piezoelectric substrate are joined with a support member located therebetween, with the first principal surface of the first piezoelectric substrate and the first principal surface of the second piezoelectric substrate facing each other, the support member surrounds a region where the first elastic wave filter and the second elastic wave filter are located in a planar view, and the out-of-band attenuation of the first elastic wave filter is greater than the out-of-band attenuation of the second elastic wave filter.

In a preferred embodiment of the present invention, a maximum value of out-of-band attenuation in a frequency band in a range between about 0.85 times and about 1.15 times a center frequency of a passband of the first elastic wave filter, both inclusive, is greater than any out-of-band attenuation in a frequency band in a range between about 0.85 times and about 1.15 times a center frequency of a passband of the second elastic wave filter, both inclusive. In this case, the ground impedance of the first elastic wave filter, whose out-of-band attenuation in the foregoing range is greater, is able to be reduced. Accordingly, an increase of the out-of-band attenuation is able to be provided.

In another preferred embodiment of the present invention, the first elastic wave filter includes a first longitudinally coupled resonator elastic wave filter, the second elastic wave filter includes a second longitudinally coupled resonator elastic wave filter, and the first longitudinally coupled resonator elastic wave filter has a larger number of stages than the second longitudinally coupled resonator elastic wave filter. In this case, the out-of-band attenuation is able to be significantly increased.

In still another preferred embodiment of the present invention, the first elastic wave filter includes a first ladder filter, the second elastic wave filter includes a second ladder filter, and the first ladder filter includes a larger number of elastic wave resonators than the second ladder filter. In this case, the out-of-band attenuation is able to be significantly increased.

In another preferred embodiment of the present invention, a first duplexer is located on the first principal surface of the first piezoelectric substrate, the first duplexer includes a first bandpass filter that defines and functions as the first elastic wave filter and a second bandpass filter with a passband is different from the passband of the first bandpass filter, a second duplexer is located on the first principal surface of the second piezoelectric substrate, the second duplexer includes a third bandpass filter that defines and functions as the second elastic wave filter and a fourth bandpass filter with a passband is different from the passband of the third bandpass filter, and the attenuation of the first bandpass filter at a frequency band corresponding to the passband of the second bandpass filter is greater than the attenuation of the third bandpass filter at a frequency band corresponding to the passband of the fourth bandpass filter. In this case, the ground impedance of the first bandpass filter, with the greater attenuation in the foregoing frequency band, is able to be reduced. Accordingly, isolation characteristics of a quadplexer including the first duplexer and the second duplexer is able to be significantly increased.

In still another preferred embodiment of the present invention, the elastic wave device further includes a first connection wiring that electrically connects the ground terminal and the first elastic wave filter, and a second connection wiring that electrically connects the ground terminal and the second elastic wave filter, wherein a length of the first connection wiring is shorter than a length of the second connection wiring. In this case, the ground impedance of the first elastic wave filter is able to be reduced. Accordingly, the out-of-band attenuation is able to be significantly increased.

An elastic wave module according to a preferred embodiment of the present invention includes a mounting board and an elastic wave device according to a preferred embodiment of the present invention and mounted on the mounting board. Accordingly, a significant increase of the out-of-band attenuation is able to be provided.

According to preferred embodiments of the present invention, elastic wave devices and elastic wave modules that have large out-of-band attenuations are provided.

The above and other elements, features, steps, characteristics and advantages of the preferred embodiments of present invention will become more apparent from the following detailed description of the preferred embodiments with reference to the attached drawings.

DETAILED DESCRIPTION OF THE PREFERRED EMBODIMENTS

Hereinafter the present invention is disclosed in detail by describing specific preferred embodiments of the present invention with reference to the drawings.

Each preferred embodiment described in the present specification is for illustrative purposes only, and elements and components of different preferred embodiments may be combined or partially exchanged.

First Preferred Embodiment

Figure 1:
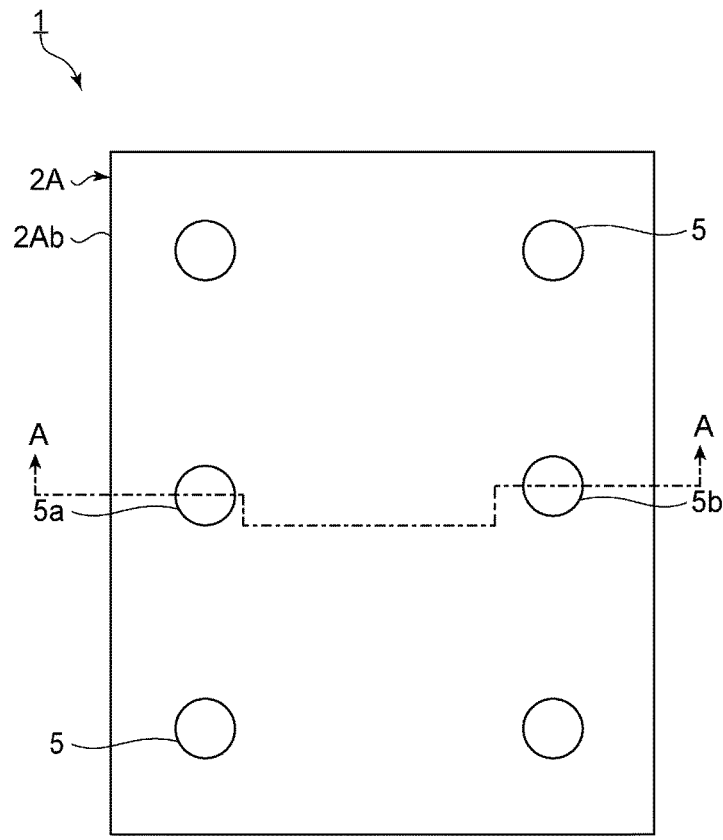
FIG. 1 is a plan view of an elastic wave device according to a first preferred embodiment of the present invention.
Figure 2:
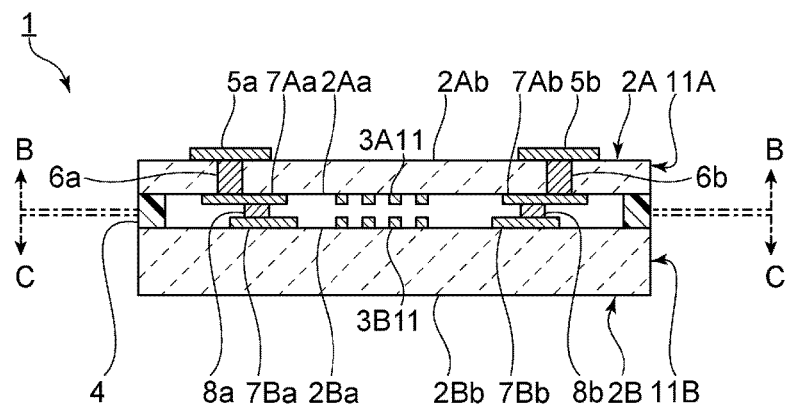
FIG. 2 is a stair cross-sectional view at line A-A of FIG. 1.

FIG. 1 is a plan view of an elastic wave device according to a first preferred embodiment of the present invention. FIG. 2 is a stair cross-sectional view at line A-A of FIG. 1.

As depicted in FIG. 2, an elastic wave device 1 includes a first elastic wave element 11A and a second elastic wave element 11B. The first elastic wave element 11A includes a first piezoelectric substrate 2A. The first piezoelectric substrate 2A includes a first principal surface 2Aa and a second principal surface 2Ab disposed opposite to the first principal surface 2Aa. The second elastic wave element 11B includes a second piezoelectric substrate 2B. The second piezoelectric substrate 2B includes a first principal surface 2Ba and a second principal surface 2Bb. The thickness of the first piezoelectric substrate 2A is less than the thickness of the second piezoelectric substrate 2B. The first piezoelectric substrate 2A and the second piezoelectric substrate 2B include a piezoelectric single crystal, for example, $LiTaO_3$, $LiNbO_3$, and the like. Alternatively, the first piezoelectric substrate 2A and the second piezoelectric substrate 2B may include a piezoelectric ceramic, for example.

On the first principal surface 2Aa of the first piezoelectric substrate 2A, a plurality of first IDT electrodes 3A11 is provided. A surface acoustic wave is excited by applying an alternating-current voltage to the IDT electrode. Although not depicted in FIG. 2, reflectors are preferably located on both sides of each first IDT electrode 3A11 in a propagation direction of the surface acoustic wave. Thus, a plurality of elastic wave resonators is provided. The foregoing plurality of elastic wave resonators is electrically connected to define a ladder filter, as described below. Thus, a first elastic wave filter is provided. On the first principal surface 2Ba of the second piezoelectric substrate 2B, a plurality of second IDT electrodes 3B11 is provided. The plurality of second IDT electrodes 3B11 and a plurality of reflectors define a plurality of elastic wave resonators. A second elastic wave filter is defined by interconnecting the plurality of elastic wave resonators.

The first IDT electrode 3A11 and the second IDT electrode 3B11 include a metal. The IDT electrode may include, for example, a single metal layer or a multilayer body in which a plurality of metal layers is stacked on top of each other.

The out-of-band attenuation of the first elastic wave filter is greater than the out-of-band attenuation of the second elastic wave filter.

The first piezoelectric substrate 2A and the second piezoelectric substrate 2B are joined with a support member 4 located therebetween, with the first principal surface 2Aa of the first piezoelectric substrate 2A and the first principal surface 2Ba of the second piezoelectric substrate 2B facing each other. The support member 4 surrounds a region where the first elastic wave filter and the second elastic wave filter are located, in a planar view. The support member 4 includes a resin, solder, or the like.

As depicted in FIG. 1, a plurality of external connection terminals 5 is located on the second principal surface 2Ab of the first piezoelectric substrate 2A. The plurality of external connection terminals 5 includes ground terminals 5a and 5b.

As depicted in FIG. 2, via hole electrodes 6a and 6b are penetrate through the first piezoelectric substrate 2A. Upper end portions of the via hole electrodes 6a and 6b are electrically connected to the ground terminals 5a and 5b, respectively. Lower end portions of the via hole electrodes 6a and 6b are electrically connected to connection terminals 7Aa and 7Ab located on the first principal surface 2Aa of the first piezoelectric substrate 2A, respectively. Although not depicted in FIG. 2, the connection terminals 7Aa and 7Ab are electrically connected to the first elastic wave filter.

On the first principal surface 2Ba of the second piezoelectric substrate 2B, connection terminals 7Ba and 7Bb are provided. Although not depicted in FIG. 2, the connection terminals 7Ba and 7Bb are electrically connected to the second elastic wave filter. The connection terminal 7Ba is electrically connected to the connection terminal 7Aa via connecting wiring 8a. The connection terminal 7Bb is electrically connected to the connection terminal 7Ab via connecting wiring 8b.

Here, the wiring connecting the first elastic wave filter and ground potential is referred to as first connection wiring. The wiring connecting the second elastic wave filter and the ground potential is referred to as second connection wiring. As depicted in FIG. 2, the connection terminal 7Aa, the via hole electrode 6a, and the ground terminal 5a define the first connection wiring. The connection terminal 7Ab, the via hole electrode 6b, and the ground terminal 5b also define the first connection wiring. The connection terminal 7Ba, the connecting wiring 8a, the connection terminal 7Aa, the via hole electrode 6a, and the ground terminal 5a define the second connection wiring. The connection terminal 7Bb, the connecting wiring 8b, the connection terminal 7Ab, the via hole electrode 6b, and the ground terminal 5b also define the second connection wiring. In other words, the first elastic wave filter and the second elastic wave filter are electrically connected in common to the ground potential. As described above, the first connecting wiring does not include the connection terminal 7Ba, the connecting wiring 8a, the connection terminal 7Bb, and the connecting wiring 8b. Accordingly, the length of the first connecting wiring is shorter than the length of the second connecting wiring.

Next, specific circuit arrangements of the first elastic wave filter and the second elastic wave filter in the present preferred embodiment are described.

Figure 3A:
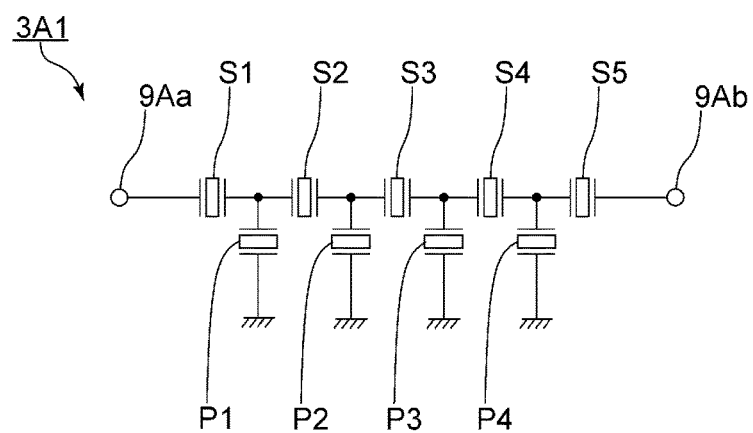
FIGS. 3A and 3B are circuit diagrams of a first elastic wave filter and a circuit diagram of a second elastic wave filter in the first preferred embodiment of the present invention, respectively.
Figure 3B:
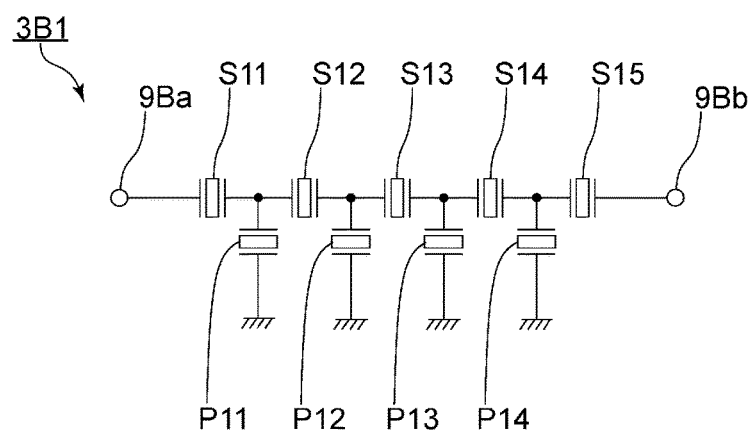

FIG. 3A is a circuit diagram of the first elastic wave filter of the first preferred embodiment, and FIG. 3B is a circuit diagram of the second elastic wave filter of the first preferred embodiment.

A first elastic wave filter 3A1 is a ladder filter. The first elastic wave filter 3A1 includes series arm resonators S1 to S5 electrically connected between an input terminal 9Aa and an output terminal 9Ab. A parallel arm resonator P1 is electrically connected between the ground potential and a connection point between the series arm resonator S1 and the series arm resonator S2. A parallel arm resonator P2 is electrically connected between the ground potential and a connection point between the series arm resonator S2 and the series arm resonator S3. A parallel arm resonator P3 is electrically connected between the ground potential and a connection point between the series arm resonator S3 and the series arm resonator S4. A parallel arm resonator P4 is electrically connected between the ground potential and a connection point between the series arm resonator S4 and the series arm resonator S5.

A second elastic wave filter 3B1 is a ladder filter with circuitry similar to the circuitry the first elastic wave filter 3A1, and includes an input terminal 9Ba, an output terminal 9Bb, series arm resonators S11 to S15, and parallel arm resonators P11 to P14.

Figure 4:
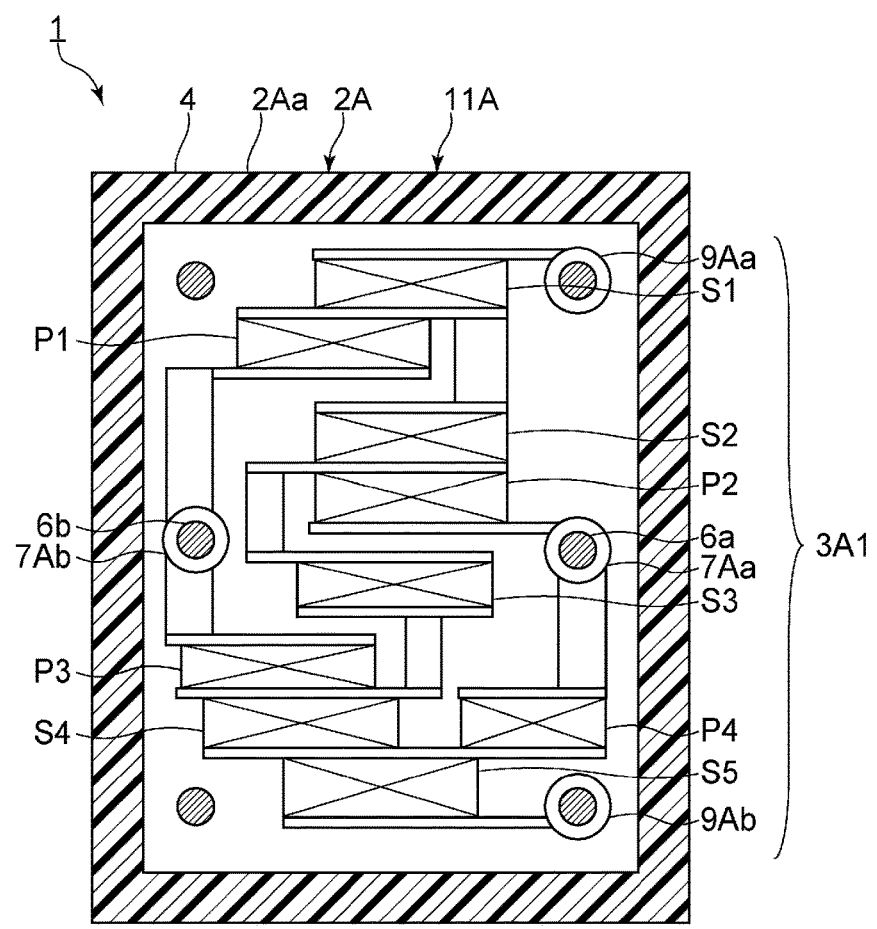
FIG. 4 is a cross-sectional view at line B-B of FIG. 2.
Figure 5:
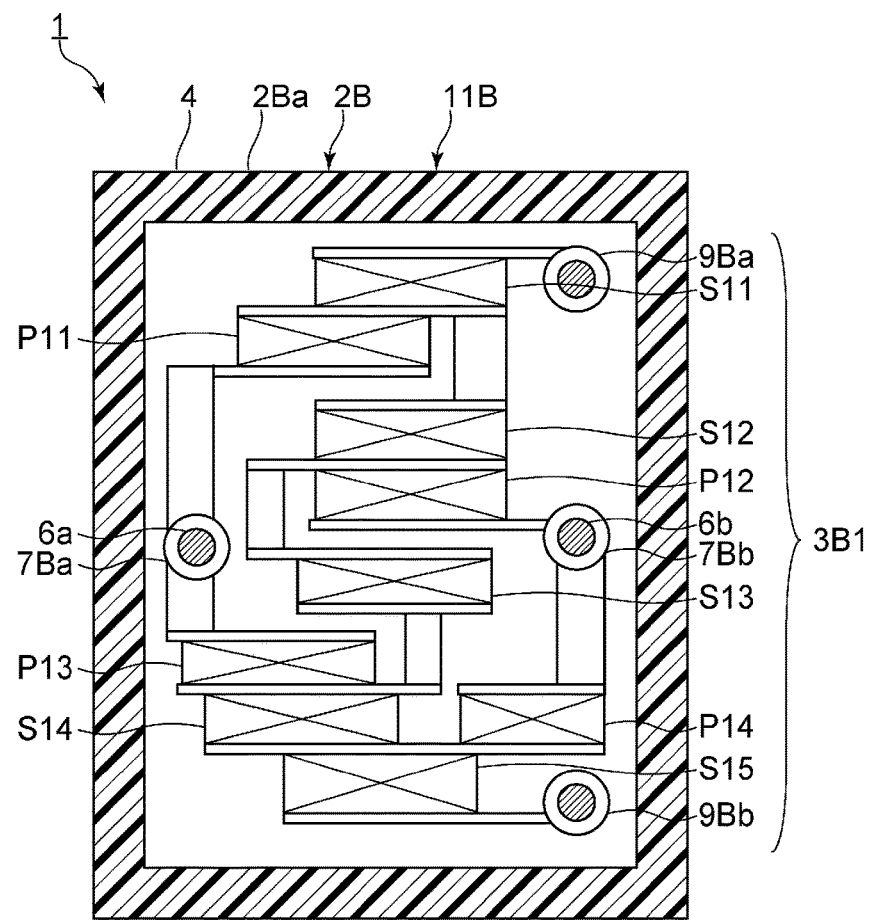
FIG. 5 is a cross-sectional view at line C-C of FIG. 2.

FIG. 4 is a cross-sectional view along line B-B of FIG. 2 and depicts the electrode arrangement of the first elastic wave filter in the first preferred embodiment. FIG. 5 is a cross-sectional view along line C-C of FIG. 2 and depicts the electrode arrangement of the second elastic wave filter in the first preferred embodiment. As described above, each elastic wave resonator includes the IDT electrode and the reflectors. Each elastic wave resonator is represented by the schematic symbol that is a rectangular frame surrounding the letter X.

The parallel arm resonators P1 and P3 are electrically connected to the connection terminal 7Ab. The parallel arm resonators P2 and P4 are electrically connected to the connection terminal 7Aa. The parallel arm resonators P11 and P13 are electrically connected to the connection terminal 7Ba. The parallel arm resonators P12 and P14 are electrically connected to the connection terminal 7Bb. As depicted in FIG. 2, FIG. 4, and FIG. 5, the parallel arm resonators P1, P3, P12, and P14 are electrically connected in common to the ground potential via the connection terminals 7Ab and 7Bb. The parallel arm resonators P2, P4, P11, and P13 are electrically connected in common to the ground potential via the connection terminals 7Aa and 7Ba.

In the present preferred embodiment, the first elastic wave filter 3A1 is electrically connected to the ground potential via the first connecting wiring whose length is relatively shorter, and the out-of-band attenuation of the first elastic wave filter 3A1 is greater than the out-of-band attenuation of the second elastic wave filter 3B1. Accordingly, a significant increase in out-of-band attenuation of the elastic wave device 1 is able to be provided, as discussed below.

The inventor of the present invention prepared non-limiting examples of elastic wave devices according to the first preferred embodiment and a first comparison example and studied their out-of-band attenuations.

The elastic wave device of the first comparison example includes features similar to the features of the first preferred embodiment except the arrangement of the first elastic wave filter and the second elastic wave filter. Specifically, the second elastic wave filter of the first comparison example was located on the first principal surface of the first piezoelectric substrate of the first elastic wave element. The first elastic wave filter of the first comparison example was located on the first principal surface of the second piezoelectric substrate of the second elastic wave element.

Here, the passband of the first elastic wave filter is between about 2400 MHz and about 2482 MHz, inclusive. The passband of the second elastic wave filter is between about 1559 MHz and about 1608 MHz, inclusive.

Figure 6:
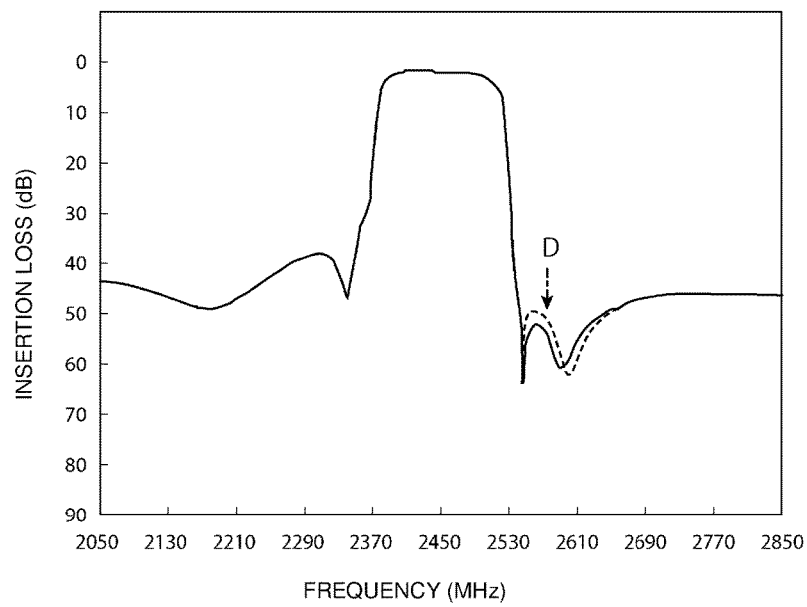
FIG. 6 is a diagram depicting attenuation frequency characteristics of the first elastic wave filters in the first preferred embodiment of the present invention and a first comparison example.
Figure 7:
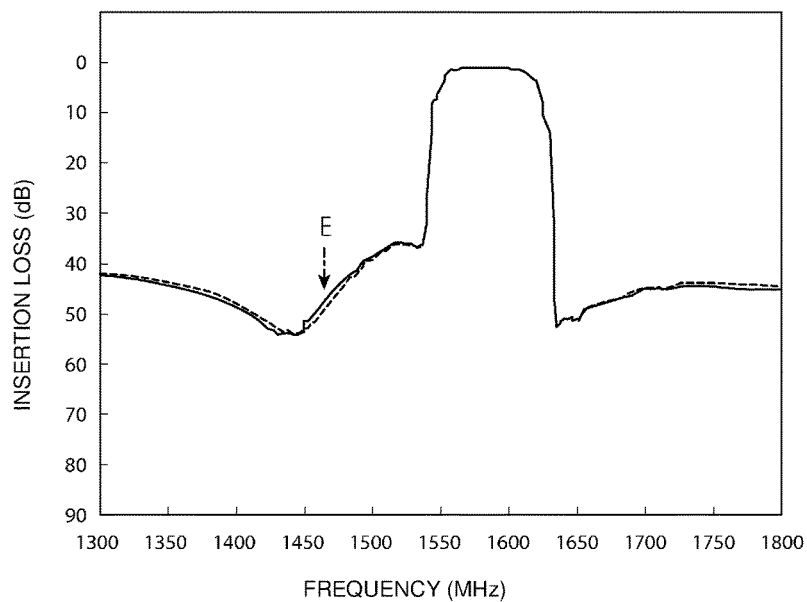
FIG. 7 is a diagram depicting attenuation frequency characteristics of the second elastic wave filters in the first preferred embodiment of the present invention and the first comparison example.

FIG. 6 is a diagram depicting attenuation frequency characteristics of the first elastic wave filters in the first preferred embodiment and the first comparison example. FIG. 7 is a diagram depicting attenuation frequency characteristics of the second elastic wave filters in the first preferred embodiment and the first comparison example. The solid line in FIGS. 6 and 7 represents a result of the first preferred embodiment, and the dashed line in FIGS. 6 and 7 represents a result of the first comparison example.

As depicted in FIG. 6, the out-of-band attenuation of the first elastic wave filter of the present preferred embodiment at frequency D is about 53.3 dB, and the out-of-band attenuation of the first comparison example at frequency D is about 50.5 dB, for example. Thus, in the present preferred embodiment, the out-of-band attenuation increases by about 2.8 dB, compared with the first comparison example. The reason for this increase in the out-of-band attenuation is explained below.

The wiring connecting the ground potential and the elastic wave filter has a ground impedance. As the length of the wiring increases, the ground impedance becomes larger. When the ground impedance becomes larger, the out-of-band attenuation of the elastic wave filter becomes smaller. The first elastic wave filter of the present preferred embodiment and the ground potential are electrically connected via the first connecting wiring. The first elastic wave filter of the first comparison example and the ground potential are electrically connected via the second connecting wiring. The length of the first connection wiring is shorter than the length of the second connecting wiring. Thus, the ground impedance of the first connection wiring is less than the ground impedance of the second connecting wiring. Accordingly, the out-of-band attenuation of the first elastic wave filter of the present preferred embodiment is able to be increased.

As depicted in FIG. 7, the out-of-band attenuation of the second elastic wave filter of the present preferred embodiment at frequency E is about 48.2 dB, and the out-of-band attenuation of the second elastic wave filter of the first comparison example at frequency E is about 49.4 dB. For reasons similar to those described above, the out-of-band attenuation of the second elastic wave filter of the present preferred embodiment at frequency E is smaller. However, the foregoing decrease is only about 1.2 dB, which is less than the increase in out-of-band attenuation of the first elastic wave filter. Accordingly, the out-of-band attenuation of the elastic wave device as a whole is able to be significantly increased.

Preferably, for example, the maximum value of out-of-band attenuation in a frequency band in the range between about 0.85 times and about 1.15 times the center frequency of the passband of the first elastic wave filter, both inclusive, is greater than any out-of-band attenuation in a frequency band in the range between about 0.85 times and about 1.15 times the center frequency of the passband of the second elastic wave filter, both inclusive. Accordingly, a significant increase in out-of-band attenuation of the elastic wave device as a whole is able to be provided.

Second Preferred Embodiment

Figure 8:
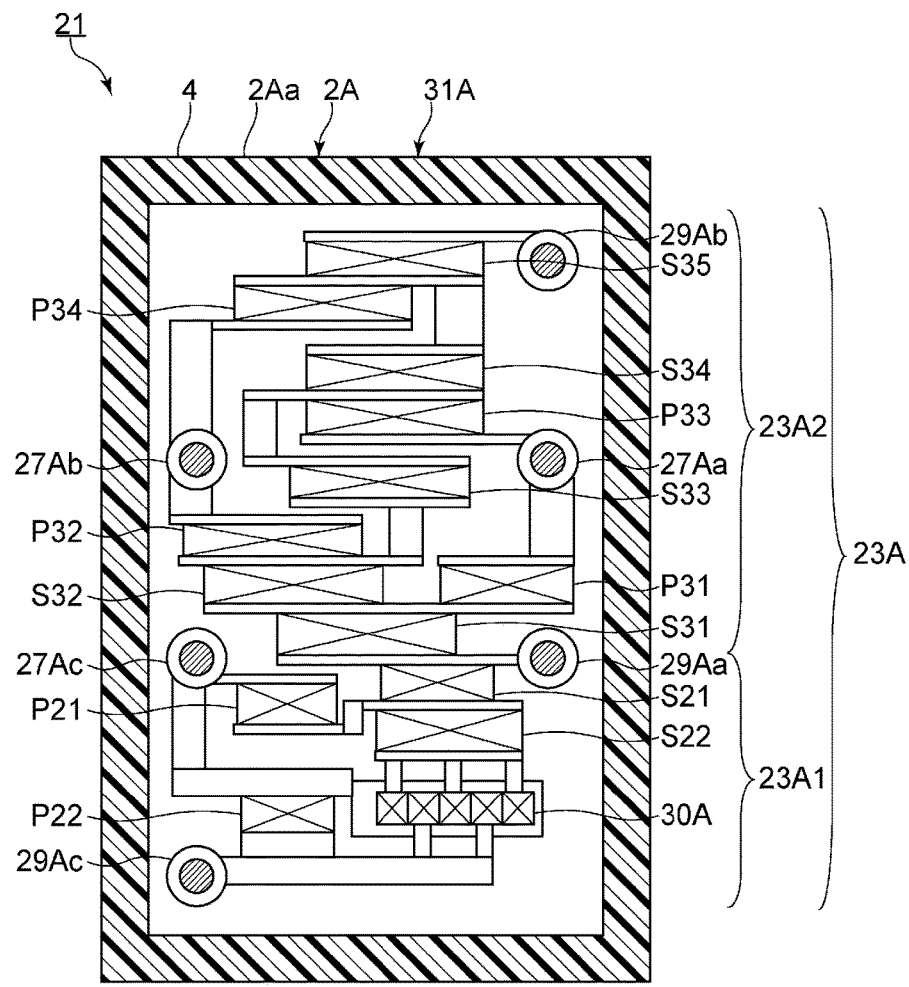
FIG. 8 is a top cross-sectional view depicting an electrode arrangement on a first principal surface of a first piezoelectric substrate in a second preferred embodiment of the present invention.
Figure 9:
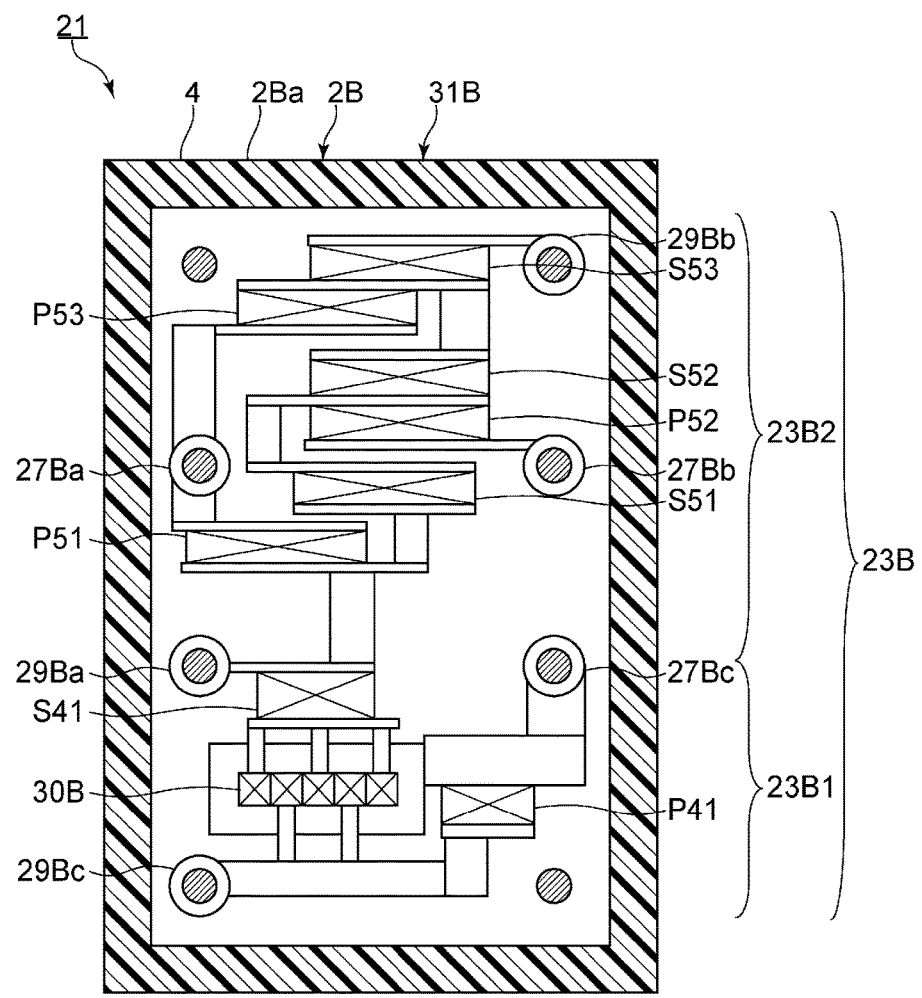
FIG. 9 is a top cross-sectional view depicting an electrode arrangement on a first principal surface of a second piezoelectric substrate in the second preferred embodiment of the present invention.
Figure 10A:
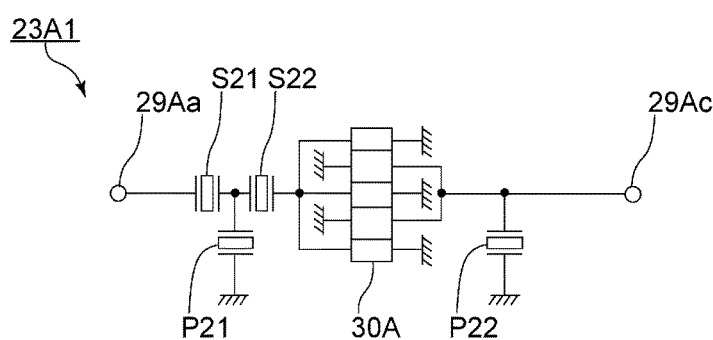
FIGS. 10A-10D are circuit diagrams of a first bandpass filter to a fourth bandpass filter in the second preferred embodiment of the present invention.
Figure 10B:
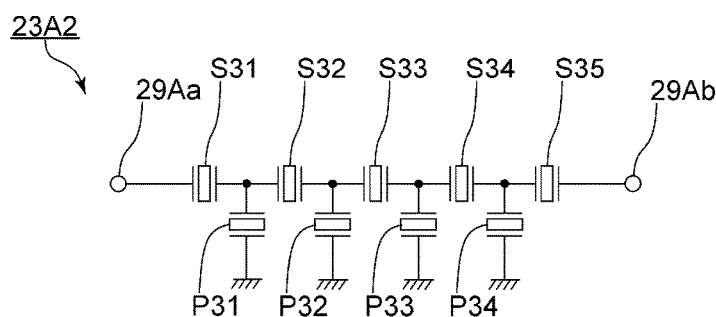
Figure 10C:
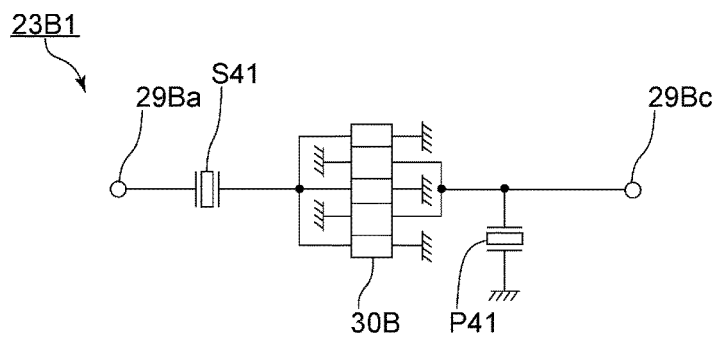
Figure 10D:
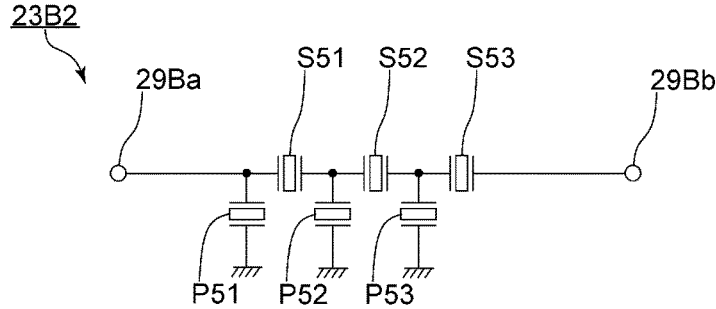

FIG. 8 is a top cross-sectional view depicting an electrode arrangement on a first principal surface of a first piezoelectric substrate according to a second preferred embodiment of the present invention. FIG. 9 is a top cross-sectional view depicting an electrode arrangement on a first principal surface of a second piezoelectric substrate in the second preferred embodiment.

An elastic wave device 21 of the second preferred embodiment includes a structure similar to the structure of the first preferred embodiment except the circuitry differs from the first preferred embodiment.

A first duplexer 23A is located on a first principal surface 2Aa of a first piezoelectric substrate 2A in a first elastic wave element 31A of the elastic wave device 21. The first duplexer 23A includes a first bandpass filter 23A1 that defines and functions as the first elastic wave filter and a second bandpass filter 23A2 whose passband is different from the passband of the first bandpass filter 23A1. A second duplexer 23B is located on a first principal surface 2Ba of a second piezoelectric substrate 2B in a second elastic wave element 31B. The second duplexer 23B includes a third bandpass filter 23B1 and a fourth bandpass filter 23B2 whose passband is different from the passband of the third bandpass filter 23B1. In other words, the elastic wave device 21 is a quadplexer including the first to fourth bandpass filters 23A1, 23A2, 23B1, and 23B2. The first bandpass filter 23A1 and the third bandpass filter 23B1 are receive filters, and the second bandpass filter 23A2 and the fourth bandpass filter 23B2 are transmit filters.

FIGS. 10A-10D are circuit diagrams of a first bandpass filter to a fourth bandpass filter according to the second preferred embodiment.

The first bandpass filter 23A1 includes a longitudinally coupled resonator elastic wave filter 30A. Series arm resonators S21 and S22 are electrically connected between an input terminal 29Aa and the longitudinally coupled resonator elastic wave filter 30A. A parallel arm resonator P21 is electrically connected between a ground potential and a connection point between the series arm resonator S21 and the series arm resonator S22. A parallel arm resonator P22 is electrically connected between the ground potential and a connection point between the longitudinally coupled resonator elastic wave filter 30A and an output terminal 29Ac.

The second bandpass filter 23A2 includes series arm resonators S31 to S35 electrically connected between an input terminal 29Aa and an output terminal 29Ab. A parallel arm resonator P31 is electrically connected between the ground potential and a connection point between the series arm resonator S31 and the series arm resonator S32. A parallel arm resonator P32 is electrically connected between the ground potential and a connection point between the series arm resonator S32 and the series arm resonator S33. A parallel arm resonator P33 is electrically connected between the ground potential and a connection point between the series arm resonator S33 and the series arm resonator S34. A parallel arm resonator P34 is electrically connected between the ground potential and a connection point between the series arm resonator S34 and the series arm resonator S35.

The third bandpass filter 23B1 includes a longitudinally coupled resonator elastic wave filter 30B. A series arm resonator S41 is electrically connected between an input terminal 29Ba and the longitudinally coupled resonator elastic wave filter 30B. A parallel arm resonator P41 is electrically connected between the ground potential and a connection point between the longitudinally coupled resonator elastic wave filter 30B and an output terminal 29Bc.

The fourth bandpass filter 23B2 includes series arm resonators S51 to S53 electrically connected between an input terminal 29Ba and an output terminal 29Bb. A parallel arm resonator P51 is electrically connected between the ground potential and a connection point between the input terminal 29Ba and the series arm resonator S51. A parallel arm resonator P52 is electrically connected between the ground potential and a connection point between the series arm resonator S51 and the series arm resonator S52. A parallel arm resonator P53 is electrically connected between the ground potential and a connection point between the series arm resonator S52 and the series arm resonator S53.

As depicted in FIG. 8, the parallel arm resonators P21 and P22 are electrically connected to a connection terminal 27Ac. The parallel arm resonators P31 and P33 are electrically connected to a connection terminal 27Aa. The parallel arm resonators P32 and P34 are electrically connected to a connection terminal 27Ab. As depicted in FIG. 9, the parallel arm resonator P41 is electrically connected to a connection terminal 27Bc. The parallel arm resonators P51 and P53 are electrically connected to a connection terminal 27Ba. The parallel arm resonator P52 is electrically connected to a connection terminal 27Bb. The parallel arm resonators P21, P22, and P41 are electrically connected in common to the ground potential via the connection terminals 27Ac and 27Bc. The parallel arm resonators P31, P33, P51, and P53 are electrically connected in common to the ground potential via the connection terminals 27Aa and 27Ba. The parallel arm resonators P32, P34, and P52 are electrically connected in common to the ground potential via the connection terminals 27Ab and 27Bb.

Next, the inventor of the present invention prepared non-limiting examples of elastic wave devices according to the second preferred embodiment and a second comparison example, and studied their out-of-band attenuations. Specifically, the attenuation of the first bandpass filter at a frequency band corresponding to the passband of the second bandpass filter was studied. The attenuation of the third bandpass filter at a frequency band corresponding to the passband of the fourth bandpass filter was evaluated.

The second comparison example includes features similar to the features of the second preferred embodiment except that the arrangement of the first to fourth bandpass filters is different from the second preferred embodiment. Specifically, the first bandpass filter and the second bandpass filter of the second comparison example were located on the first principal surface of the second piezoelectric substrate. The third bandpass filter and the fourth bandpass filter of the second comparison example were located on the first principal surface of the first piezoelectric substrate.

Here, the passband of the first bandpass filter preferably is between about 2110 MHz and about 2170 MHz, inclusive, for example. The passband of the second bandpass filter preferably is between about 1920 MHz and about 1980 MHz, inclusive, for example. The passband of the third bandpass filter preferably is between about 1805 MHz and about 1880 MHz, inclusive, for example. The passband of the fourth bandpass filter preferably is between about 1710 MHz and about 1785 MHz, inclusive, for example.

Figure 11:
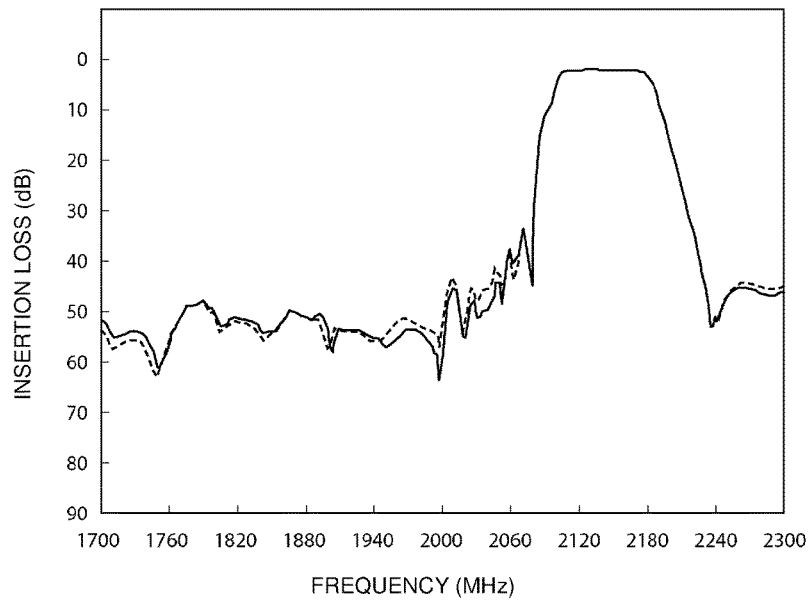
FIG. 11 is a diagram depicting attenuation frequency characteristics of the first bandpass filters in the second preferred embodiment of the present invention and a second comparison example.
Figure 12:
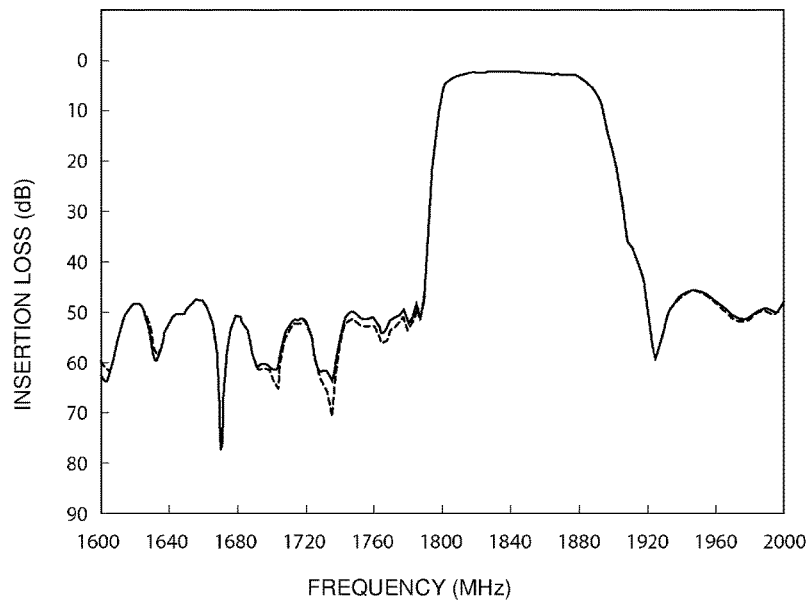
FIG. 12 is a diagram depicting attenuation frequency characteristics of the third bandpass filters in the second preferred embodiment of the present invention and the second comparison example.
Figure 13A:
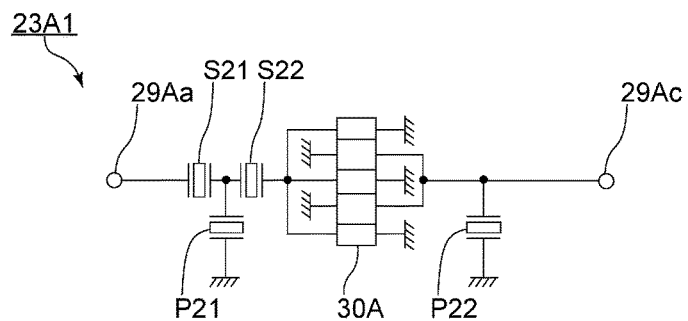
FIGS. 13A-13D are circuit diagrams of a first bandpass filter to a fourth bandpass filter in a third preferred embodiment of the present invention.
Figure 13B:
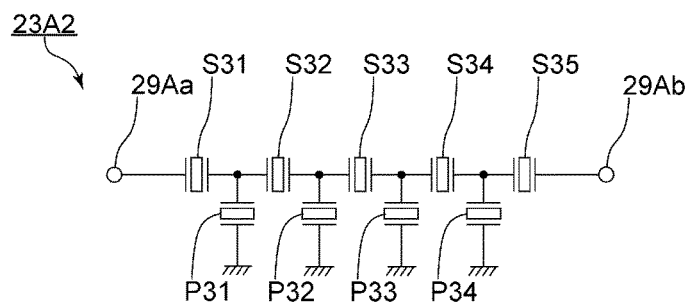
Figure 13C:
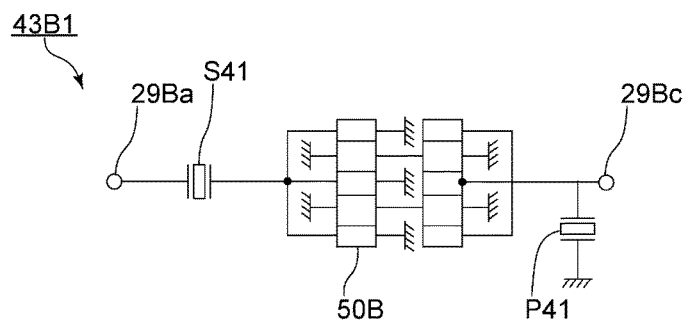
Figure 13D:
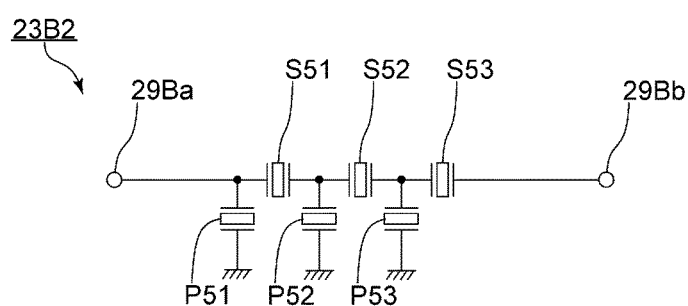

FIG. 11 is a diagram depicting attenuation frequency characteristics of the first bandpass filters in the second preferred embodiment and the second comparison example. FIG. 12 is a diagram depicting attenuation frequency characteristics of the third bandpass filters in the second preferred embodiment and the second comparison example. The solid line in FIGS. 11 and 12 represents a result of the second preferred embodiment, and the dashed line in FIGS. 11 and 12 represents a result of the second comparison example.

As depicted in FIG. 11, the attenuation of the first bandpass filter according to the present embodiment at a frequency band corresponding to the passband of the second bandpass filter is about 53.6 dB, for example. The attenuation of the first bandpass filter according to the second comparison example at a frequency band corresponding to the passband of the second bandpass filter is about 51.6 dB, for example. Thus, in the present preferred embodiment, the foregoing attenuation increases by about 2.0 dB, for example, compared with the second comparison example.

As depicted in FIG. 12, the attenuation of the third bandpass filter according to the present preferred embodiment at a frequency band corresponding to the passband of the fourth bandpass filter is about 48.0 dB, for example. The attenuation of the third bandpass filter according to the second comparison example at a frequency band corresponding to the passband of the fourth bandpass filter is about 49.2 dB, for example. Although the foregoing attenuation of the third bandpass filter is less than the attenuation of the second comparison example, the decrease in the foregoing attenuation is only about 1.2 dB, for example. The decrease in the foregoing attenuation of the third bandpass filter is less than the increase in the foregoing attenuation in the first bandpass filter. As described above, the decreases in the foregoing attenuations of the first and third bandpass filters in the first and second duplexers is able to be significantly reduced or prevented. Accordingly, isolation characteristics of elastic wave device are able to be significantly improved.

As depicted in FIG. 10, the number of elastic wave resonators included in the first bandpass filter 23A1 is greater than the number of elastic wave resonators included in the third bandpass filter 23B1. In this case, the out-of-band attenuation of the first bandpass filter 23A1 is greater than the out-of-band attenuation of the third bandpass filter 23B1. The present preferred embodiment is able to provide a decrease in ground impedance of the first bandpass filter 23A1 whose out-of-band attenuation is greater. Accordingly, the decrease in out-of-band attenuation of the elastic wave device 21 as a whole is able to be significantly reduced or prevented.

Third Preferred Embodiment

FIGS. 13A-13D are circuit diagrams of a first bandpass filter to a fourth bandpass filter according to a third preferred embodiment of the present invention.

In the present preferred embodiment, the third bandpass filter 23B1 of the second preferred embodiment depicted in FIG. 10 is implemented as a third bandpass filter 43B1. Furthermore, the present preferred embodiment differs from the second preferred embodiment in the arrangement of the first to fourth bandpass filters 23A1, 23A2, 43B1, and 23B2. Except the foregoing features, elements, and components, the present preferred embodiment includes features, elements, and components similar to the features, elements, and components of the second preferred embodiment.

Specifically, the first bandpass filter 23A1 and the second bandpass filter 23A2 are located on a first principal surface of a second piezoelectric substrate. The third bandpass filter 43B1 and the fourth bandpass filter 23B2 are located on a first principal surface of a first piezoelectric substrate whose thickness is less than the thickness of the second piezoelectric substrate. A longitudinally coupled resonator elastic wave filter 50B of the third bandpass filter 43B1 has a two-stage arrangement. In other words, the number of stages of the longitudinally coupled resonator elastic wave filter 50B is greater than the number of stages of the longitudinally coupled resonator elastic wave filter 30A of the first bandpass filter 23A1. In this case, the out-of-band attenuation of the third bandpass filter 43B1 is greater than the out-of-band attenuation of the first bandpass filter 23A1. In the present preferred embodiment, the third bandpass filter 43B1 is located on the first piezoelectric substrate. Accordingly, a significant reduction or prevention of the decrease in out-of-band attenuation of the third bandpass filter 43B1.

Accordingly, the out-of-band attenuation of the elastic wave device as a whole is able to be significantly increased.

In the present preferred embodiment, the longitudinally coupled resonator elastic wave filters 30A and 50B preferably include a single stage filter and a two-stage filter, respectively. However, the number of stages is not limited thereto as long as the bandpass filter whose number of stages in the longitudinally coupled resonator-t elastic wave filter is greater is located on the first principal surface of the first piezoelectric substrate whose thickness is less than the thickness of the second piezoelectric substrate.

Fourth Preferred Embodiment

Figure 14:
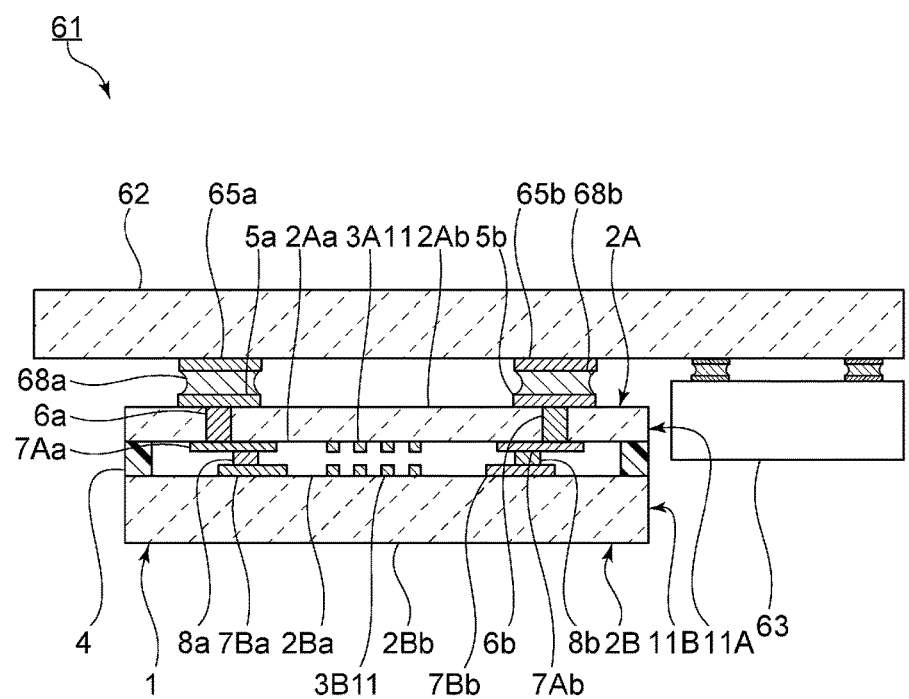
FIG. 14 is a front cross-sectional diagram of an elastic wave module that defines and functions as a fourth preferred embodiment of the present invention.

FIG. 14 is a front cross-sectional diagram of an elastic wave module according to a fourth preferred embodiment of the present invention.

As shown in FIG. 14, an elastic wave module 61 includes a mounting board 62. An elastic wave device 1 of the first preferred embodiment is mounted on the mounting board 62. Specifically, mounting terminals 65a and 65b are located on the mounting board 62. The mounting terminals 65a and 65b and ground terminals 5a and 5b of the elastic wave device 1 are respectively joined with bonding agents 68a and 68b therebetween. The bonding agents 68a and 68b include solder or the like. Although not depicted in FIG. 14, in addition to the ground terminals of the elastic wave device 1, the plurality of external connection terminals described above is also joined to a plurality of mounting terminals of the mounting board 62. Furthermore, a device 63 is mounted on the elastic wave module 61. As described above, in the elastic wave module 61, a device or an element is able to be mounted in addition to the elastic wave device 1. Since the elastic wave module 61 includes the mounted elastic wave device 1, the out-of-band attenuation is able to be significantly increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a first piezoelectric substrate including a first principal surface and a second principal surface;
a second piezoelectric substrate including a first principal surface and a second principal surface, a thickness of the second piezoelectric substrate being greater than a thickness of the first piezoelectric substrate;
a plurality of first interdigital transducer (IDT) electrodes and a plurality of second IDT electrodes, the plurality of first IDT electrodes being located on the first principal surface of the first piezoelectric substrate, and the plurality of second IDT electrodes being located on the first principal surface of the second piezoelectric substrate; and
a plurality of external connection terminals located on the second principal surface of the first piezoelectric substrate; wherein
a first elastic wave filter including the plurality of first IDT electrodes is located on the first principal surface of the first piezoelectric substrate;
a second elastic wave filter including the plurality of second IDT electrodes is located on the first principal surface of the second piezoelectric substrate;
at least one of the plurality of external connection terminals is a ground terminal;
the first piezoelectric substrate and the second piezoelectric substrate are joined with a support member located therebetween, with the first principal surface of the first piezoelectric substrate and the first principal surface of the second piezoelectric substrate facing each other;
the support member surrounds a region where the first elastic wave filter and the second elastic wave filter are located, in a planar view;
out-of-band attenuation of the first elastic wave filter is greater than out-of-band attenuation of the second elastic wave filter; and
a maximum value of out-of-band attenuation in a frequency band in a range between about 0.85 times and about 1.15 times a center frequency of a passband of the first elastic wave filter, both inclusive, is greater than any out-of-band attenuation in a frequency band in a range between about 0.85 times and about 1.15 times a center frequency of a passband of the second elastic wave filter, both inclusive.

2. The elastic wave device according to claim 1, further comprising:
a first connection wiring that electrically connects the ground terminal and the first elastic wave filter; and
a second connection wiring that electrically connects the ground terminal and the second elastic wave filter; wherein
a length of the first connection wiring is shorter than a length of the second connection wiring.

3. The elastic wave device according to claim 2, wherein the first connection wiring and the second connection wiring each include via hole electrodes that penetrate the first piezoelectric substrate.

4. The elastic wave device according to claim 1, wherein the first elastic wave filter includes a first ladder filter;
the second elastic wave filter includes a second ladder filter; and
the first ladder filter includes a larger number of elastic wave resonators than the second ladder filter.

5. The elastic wave device according to claim 4, wherein the first elastic wave filter includes a plurality of series arm resonators electrically connected between an input terminal and an output terminal.

6. The elastic wave device according to claim 5, wherein the first elastic wave filter includes a plurality of parallel arm resonators that are each electrically connected between a ground potential and a connection between two series arm resonators of the plurality of series arm resonators.

7. The elastic wave device according to claim 4, wherein the second elastic wave filter includes a plurality of series arm resonators electrically connected between an input terminal and an output terminal.

8. The elastic wave device according to claim 5, wherein the second elastic wave filter includes a plurality of parallel arm resonators that are each electrically connected between a ground potential and a connection between two series arm resonators of the plurality of series arm resonators.

9. An elastic wave module comprising:
a mounting board; and
the elastic wave device according to claim 1, wherein the elastic wave device is mounted on the mounting board.

10. The elastic wave device according to claim 1, wherein each of the first piezoelectric substrate and the second piezoelectric includes a piezoelectric ceramic.

11. The elastic wave device according to claim 1, wherein reflectors are located on opposing sides of the first IDT electrode, in a propagation direction of a surface acoustic wave generated by applying an alternating-current voltage to the first IDT electrode.

12. The elastic wave device according to claim 1, wherein the first IDT electrode and the second IDT electrode each include a single metal layer or a multilayer body with a plurality of stacked metal layers.

13. The elastic wave device according to claim 1, wherein the support member includes resin or solder.

14. The elastic wave device according to claim 1, wherein:
a first bandpass filter and a second bandpass filter are located on a first principal surface of the second piezoelectric substrate; and
a third bandpass filter and a fourth bandpass filter are located on a first principal surface of the first piezoelectric substrate.

15. The elastic wave device according to claim 14, wherein the third bandpass filter includes a longitudinally coupled resonator elastic wave filter with a two-stage arrangement.

16. An elastic wave device comprising:
a first piezoelectric substrate including a first principal surface and a second principal surface;
a second piezoelectric substrate including a first principal surface and a second principal surface, a thickness of the second piezoelectric substrate being greater than a thickness of the first piezoelectric substrate;
a plurality of first interdigital transducer (IDT) electrodes and a plurality of second IDT electrodes, the plurality of first IDT electrodes being located on the first principal surface of the first piezoelectric substrate, and the plurality of second IDT electrodes being located on the first principal surface of the second piezoelectric substrate; and
a plurality of external connection terminals located on the second principal surface of the first piezoelectric substrate; wherein
a first elastic wave filter including the plurality of first IDT electrodes is located on the first principal surface of the first piezoelectric substrate;
a second elastic wave filter including the plurality of second IDT electrodes is located on the first principal surface of the second piezoelectric substrate;
at least one of the plurality of external connection terminals is a ground terminal;
the first piezoelectric substrate and the second piezoelectric substrate are joined with a support member located therebetween, with the first principal surface of the first piezoelectric substrate and the first principal surface of the second piezoelectric substrate facing each other;
the support member surrounds a region where the first elastic wave filter and the second elastic wave filter are located, in a planar view;
out-of-band attenuation of the first elastic wave filter is greater than out-of-band attenuation of the second elastic wave filter;
a first duplexer is located on the first principal surface of the first piezoelectric substrate;
the first duplexer includes a first bandpass filter that defines and functions as the first elastic wave filter and a second bandpass filter with a passband that is different from a passband of the first bandpass filter;
a second duplexer is located on the first principal surface of the second piezoelectric substrate;

the second duplexer includes a third bandpass filter that defines and functions as the second elastic wave filter and a fourth bandpass filter with a passband is different from a passband of the third bandpass filter; and
attenuation of the first bandpass filter at a frequency band corresponding to the passband of the second bandpass filter is greater than attenuation of the third bandpass filter at a frequency band corresponding to the passband of the fourth bandpass filter.

17. The elastic wave device according to claim 16, wherein each of the third bandpass filter and the fourth bandpass filter includes a plurality of series arm resonators electrically connected between an input terminal and an output terminal and a plurality of parallel arm resonators that are each electrically connected between a ground potential and a connection between two series arm resonators of the plurality of series arm resonators.

18. The elastic wave device according to claim 16, wherein each of the first bandpass filter and the third bandpass filter includes a longitudinally coupled resonator elastic wave filter.

19. An elastic wave device comprising:
a first piezoelectric substrate including a first principal surface and a second principal surface;
a second piezoelectric substrate including a first principal surface and a second principal surface, a thickness of the second piezoelectric substrate being greater than a thickness of the first piezoelectric substrate;
a plurality of first interdigital transducer (IDT) electrodes and a plurality of second IDT electrodes, the plurality of first IDT electrodes being located on the first principal surface of the first piezoelectric substrate, and the plurality of second IDT electrodes being located on the first principal surface of the second piezoelectric substrate; and
a plurality of external connection terminals located on the second principal surface of the first piezoelectric substrate; wherein
a first elastic wave filter including the plurality of first IDT electrodes is located on the first principal surface of the first piezoelectric substrate;
a second elastic wave filter including the plurality of second IDT electrodes is located on the first principal surface of the second piezoelectric substrate;
at least one of the plurality of external connection terminals is a ground terminal;
the first piezoelectric substrate and the second piezoelectric substrate are joined with a support member located therebetween, with the first principal surface of the first piezoelectric substrate and the first principal surface of the second piezoelectric substrate facing each other;
the support member surrounds a region where the first elastic wave filter and the second elastic wave filter are located, in a planar view;
out-of-band attenuation of the first elastic wave filter is greater than out-of-band attenuation of the second elastic wave filter;
the first elastic wave filter includes a first longitudinally coupled resonator elastic wave filter;
the second elastic wave filter includes a second longitudinally coupled resonator elastic wave filter; and
the first longitudinally coupled resonator elastic wave filter has a larger number of stages than the second longitudinally coupled resonator elastic wave filter.

* * * * *